United States Patent [19]

Chu et al.

[11] Patent Number: 5,068,020
[45] Date of Patent: Nov. 26, 1991

[54] COATED SUBSTRATES AND PROCESS

[75] Inventors: Wei-kan Chu; Charles B. Childs, both of Chapel Hill, N.C.

[73] Assignee: The University of North Carolina at Chapel Hill, Chapel Hill, N.C.

[21] Appl. No.: 377,444

[22] Filed: Jul. 10, 1989

[51] Int. Cl.$^5$ .............................................. C23C 14/46
[52] U.S. Cl. ............................ 204/192.11; 204/192.15; 204/192.17; 204/192.3
[58] Field of Search ........... 204/192.11, 192.3, 192.15, 204/192.17; 428/457

[56] References Cited

U.S. PATENT DOCUMENTS

| | | | |
|---|---|---|---|
| 2,411,867 | 12/1946 | Brenner | 428/457 X |
| 3,875,028 | 4/1975 | Atlee et al. | 204/192.11 X |
| 4,219,199 | 8/1980 | Okuda | 274/38 |
| 4,402,993 | 9/1983 | Aisenberg et al. | 427/38 |
| 4,411,963 | 10/1983 | Aine | 428/622 |
| 4,560,577 | 12/1985 | Mirtich et al. | 427/38 |
| 4,820,392 | 4/1989 | Moskowitz et al. | 204/192.11 |

FOREIGN PATENT DOCUMENTS 2749429 11/1977 Fed. Rep. of Germany .

OTHER PUBLICATIONS

R. N. Castellano et al., Vacuum, 27, No. 3, pp. 109–117, (1977).
J. E. E. Baglin, Interface Tailoring for Adhesion Using Ion Beams, Nuclear Instruments and Methods in Physics Research, 1989, pp. 764–768.

Primary Examiner—John F. Niebling
Assistant Examiner—William T. Leader
Attorney, Agent, or Firm—Cushman, Darby & Cushman

[57] ABSTRACT

Disclosed herein is a coated substrate and a process for forming films on substrates and for providing a particularly smooth film on a substrate. The method of this invention involves subjecting a surface of a substrate to contact with a stream of ions of an inert gas having sufficient force and energy to substantially change the surface characteristics of said substrate, and then exposing a film-forming material to a stream of ions of an inert gas having sufficient energy to vaporize the atoms of said film-forming material and to transmit the vaporized atoms to the substrate surface with sufficient force to form a film bonded to the substrate. This process is particularly useful commercially because it forms strong bonds at room temperature.

This invention is particularly useful for adhering a gold film to diamond and forming ohmic electrodes on diamond, but also can be used to bond other films to substrates.

6 Claims, 4 Drawing Sheets

COATED SUBSTRATES AND PROCESS

BACKGROUND OF THE INVENTION

The present invention was funded by the Office of Naval Research under contract N00014-87- K-0243.

This invention relates to a coated substrate and a process for coating substrates. More particularly, this invention relates to the deposition of a film on a substrate at an unelevated temperature. The method of this invention is particularly useful for forming a smooth, thin film of material such as gold, on diamond.

Traditionally, it has been difficult to deposit a thin film of material on a chemically inert substance. Certain materials, e.g., gold, are recognized as being particularly difficult to deposit on such substrates, and such a deposition cannot be made at room temperature using conventional methods.

Bonding between a substantially inert substrate and a film such as gold has been achieved in the past by including a thin layer of a carbide-forming refractory metal such as titanium, tantalum or tungsten between the substrate and the gold. This well-known technique requires the substrate to be heated to several hundred degrees centigrade in order to bond the refractory metal. Another disadvantage of this known technique is that refractory metals have higher electrical resistance and lower thermal conductivity than gold, and thus a coated substrate formed using a refractory metal is generally inferior to a coated substrate which has good bonding characteristics but no refractory metal.

The use of a refractory metal to deposit a film on a substrate often results in films which do not have sufficient adherent properties to be commercially useful. Furthermore, the resulting film has an uneven exterior film surface, which can be characterized as a mosaic structure, when viewed under an electron microscope. This structure can be disadvantageous in certain commercial applications in which a smooth film is necessary, e.g., laser technology. Furthermore, a mosaic bonding structure can be the cause of relatively poor bond strength for coated substrates in general. The poor bonding characteristic of the films is observed, for example, by the removal of such film by the well-known "Scotch Tape Adhesion Test."

Ion-beam mixing, which is known in the art, will cause certain film materials to bond to substrates. However, this process is not useful for coating diamond and other chemically inert substances, particularly when an unreactive film-forming material, such as gold, is used.

Thus, the methods known in the art for adhering a film to a generally inert substrate are disadvantageous in that they often require heat, and the bonding between the film and substrate is relatively weak. Furthermore, a coating which includes a refractory metal as part of the film layer (between the desired film and the substrate) can have a higher electrical resistance and lower thermal conductivity than a single-layer coating deposited directly on a substrate which does not involve a refractory metal.

SUMMARY OF THE INVENTION

An object of the present invention is to provide a strong bond between a substrate and a film deposited thereon.

Another object of this invention is to coat a substrate with a film at room temperature.

A further object of this invention is to deposit a smooth layer of film on a substrate.

Yet another object of this invention is to deposit a film directly on a substrate, e.g., without depositing a refractory metal between the film and substrate.

Another object of this invention is to deposit a strongly bonded film of refractory metal on a substrate.

Another object of this invention is to provide an ohmic electrode made of a film deposited on a substrate.

A further object of this invention is to form a coated substrate which has relatively low electrical resistance and high thermal conductivity.

Broadly speaking, the method of this invention involves a method for forming a film bonded to a substrate comprising:

(a) subjecting a surface of a substrate to contact with a stream of ions of an inert gas, said ions having sufficient force and energy to substantially change the surface characteristics of said substrate, and (b) exposing a film-forming material to a stream of ions of an inert gas having sufficient energy to vaporize and/or ionize the atoms of said film-forming material and to transmit the vaporized atoms to the substrate surface with sufficient force to form a film bonded to the substrate.

The film which is formed according to this invention can be made of any material or materials which can be bonded to a substrate after the surface structure of the substrate has been altered. The resulting film may be a various thicknesses. The material may be deposited in the form of ions or neutral atoms. A non-limiting example of a suitable material is metals. This method is particularly useful to bond metals which cannot be satisfactorily bonded by conventional techniques, e.g., gold. Other metals which may be bonded by this technique include Ti, Pt, Ta and W. Furthermore, this method is useful for producing a stronger bond between a film-forming material and a substrate than can be obtained using the processes of the prior art which use an intermediate layer of refractory metal.

The substrate according to this invention is any material to which a thin film can be attached according to the process steps described above. A benefit of this process is that many types of materials can be deposited at room temperature. As non-limiting examples, the material can be a carbon-containing compound, e.g., diamond, graphite or polymer, a glass, or. a ceramic.

Regarding the first step of the process of this invention, the substrate surface is subjected to contact with ions of an inert gas by any suitable method which will produce a force sufficient to substantially change the surface structure of the substrate and to eventually result in sufficient bond strength between the film material and the substrate. "Sufficient adhesion" generally will depend both upon the particular film and substrate involved and upon the intended use for the final film-/substrate product. Contact between the inert gas ions and the substrate can be effected by sputtering the substrate, for example, particularly ion sputtering.

Film strength can be measured by any suitable means. As a non-limiting example, the "Scotch Tape Adhesion Test" may be used, employing tapes with various strengths depending upon the desired strength of the bonded film.

The ions of inert gas according to this invention can be any inert gas ions. As non-limiting examples, Ar, Ne, Kr, Xe or He ions can be used.

With regard to the second step of this invention, the exposure of the substrate surface to an ion stream can be effected by any means which will result in sufficient bonding of the film-forming material and the substrate. The distance between the gold and diamond, and the angular position of the diamond holder, are set such that the gold will contact the diamond with a force sufficient to bond a film material to the substrate.

As a non-limiting example of a suitable method for exposing the substrate to a film-forming material, the film-forming material may be sputtered, resulting in the movement of film-forming atoms toward the substrate surface and their subsequent bonding to the substrate.

The process of this invention may be conducted at any suitable temperature and pressure. One of the most significant advantages of this invention is that the process can be conducted at room temperature. It is believed that the process also will be useful at higher and lower temperatures. While the method of this invention is preferably conducted at pressures on the order of $10^{-5}$ torr, it is believed that higher and lower pressures can be used.

In certain circumstances, it may be desirable to remove contaminants from the surface of the substrate before contacting it with ions of an inert gas in order to result in a stronger bond between the film and substrate. Any conventional cleaning method may be used, for example, a chemical cleaning process.

Another significant aspect of the present invention is that films deposited according to this process have a surprisingly smooth exterior surface. Thus, this invention is particularly useful for applications in which this characteristic is desirable, for example, mirrors, heat sinks, lasers, light pipes, and films to be chemically reacted with a substrate.

Other objects, methods and characteristics of the invention will become apparent upon consideration of the following detailed description, which is not intended to limit the scope of this invention, and the claims.

DETAILED DESCRIPTION OF THE PREFERRED EMBODIMENT

According to the preferred embodiment of this invention, gold was adhered to diamond by ion-beam sputtering. In brief, this process involved sputtering of a diamond substrate with argon ions, followed by sputtering of high purity gold with argon ions, causing the gold to bond to the surface of the diamond. A conventional sputtering chamber was used, in which was mounted a custom-built specimen holder.

Figure 2:
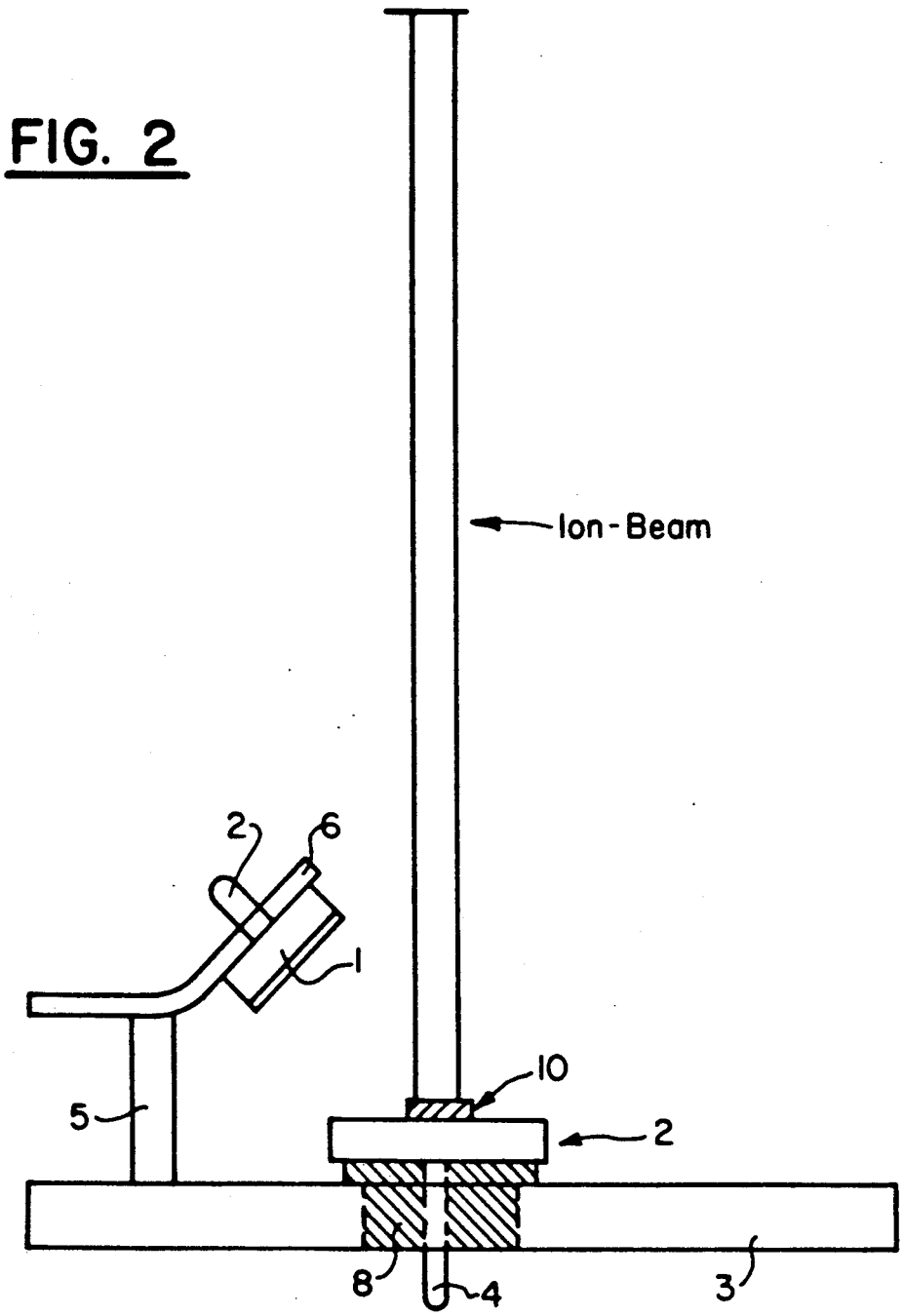
FIG. 2 shows the apparatus as it is used according to the second step of the preferred embodiment of this invention.
Figure 3:
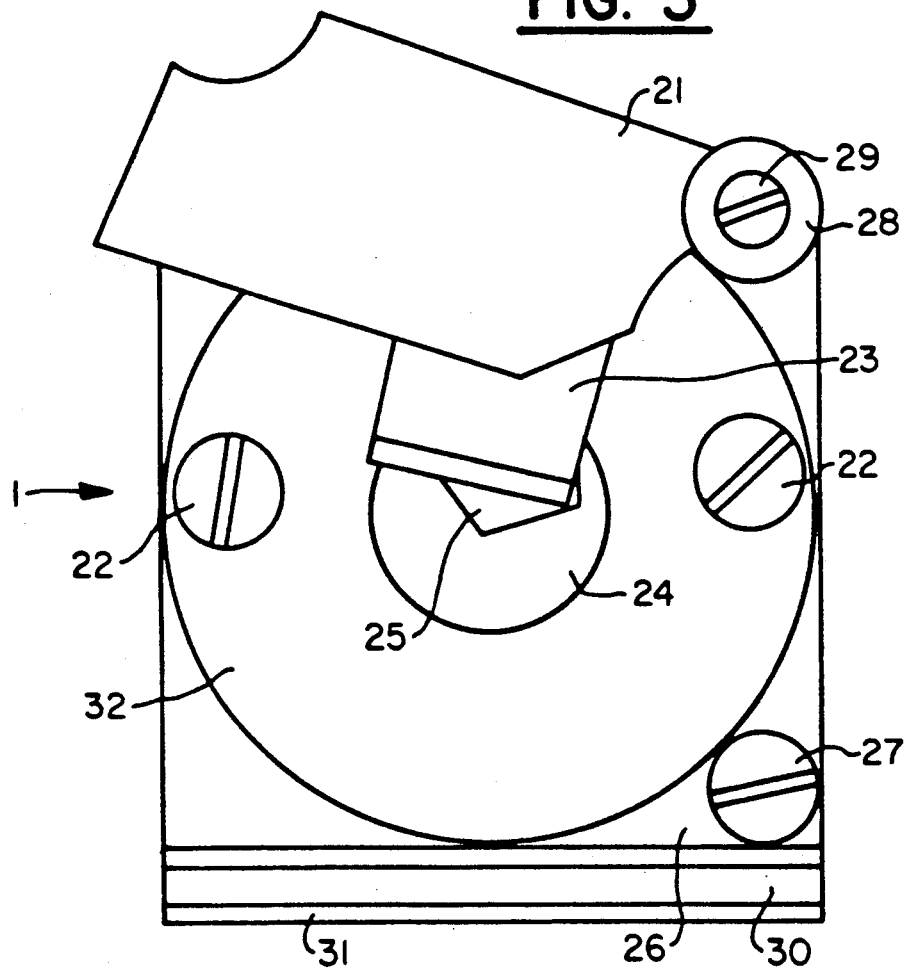
FIG. 3 depicts the specimen holder used in the preferred embodiment of this invention.
Figure 4:
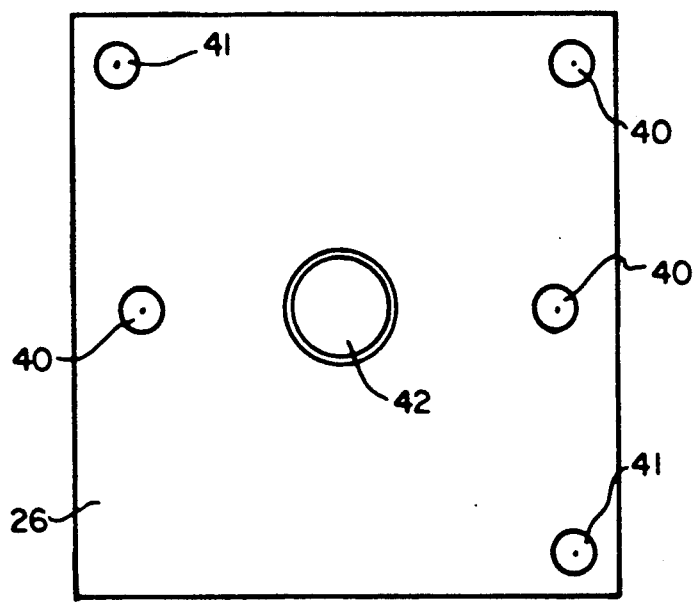
FIG. 4 shows the dimensions of the upper portion of the specimen holder according to Example 1 below.
Figure 5:
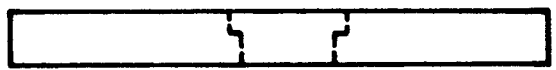
FIG. 5 shows the dimensions of the sputtering pedestal used in Example 1.

The specimen holder 1 of the preferred embodiment is made of brass, however, any suitable material may be used. As shown in FIG. 3, the holder has a circular ring 32 mounted on a three-piece support member 26, 30, 31. The dimensions of top portion 26 of the support member, including circular holes, are shown in FIG. 4. Screws 22 hold the ring 32 in place and screws 27 and 29 fasten the ring 32 to the support member 26, 30, with hole 42 and smaller hole 42' in support member 26. Washer 28 is placed between the head of screw 29 and pivoting cover 21. Ring 32 has a circular hole in the center 24 and smaller hole 24' onto which is deposited diamond 25. Mask 23 is sandwiched between ring 32 and pivoting cover 21, and screw 29 is adjusted to hold mask 23 in place. Specimen holder 1 is mounted on sputtering pedestal 2 (Figs. 1, 2 and 5) having a mounting axle 4. It is noted that the dimensions of the specimen holder were not critical to operation of this device, but were adapted to accommodate the diamond pieces which were used.

A diamond plate 25 was chemically cleaned and placed in a conventional ion-beam sputtering chamber. The diamond was placed in specimen holder 1, which was placed on sputtering pedestal 2 of the apparatus shown in Fig. 1. The plate was then sputtered with Ar ions at a beam energy of about 14 Kev, a beam current of a few milliamps, a pressure of about $4-10 \times 10^{-5}$ torr, for about 5 to 15 minutes. It is believed that this rate could have been varied significantly and still have been within the scope of the invention. The sputterbell parameters of the sputtering apparatus were adjusted to produce the above-mentioned conditions of current, etc., as can be done by one skilled in the art.

The diamond was removed from the path of the ion beam, and a piece of gold 10 was placed on sputtering pedestal 2 in the ion beam path. Specimen holder 1 was mounted on bent plate 6, made of stainless steel, about $1\frac{1}{4}$ inches from gold 10, at an angle such that a portion of gold 10 could be transferred to the surface of diamond 25. Bent plate 6 was mounted on plate support 5, made of copper, which in turn was mounted on base 3, made of copper.

Figure 1:
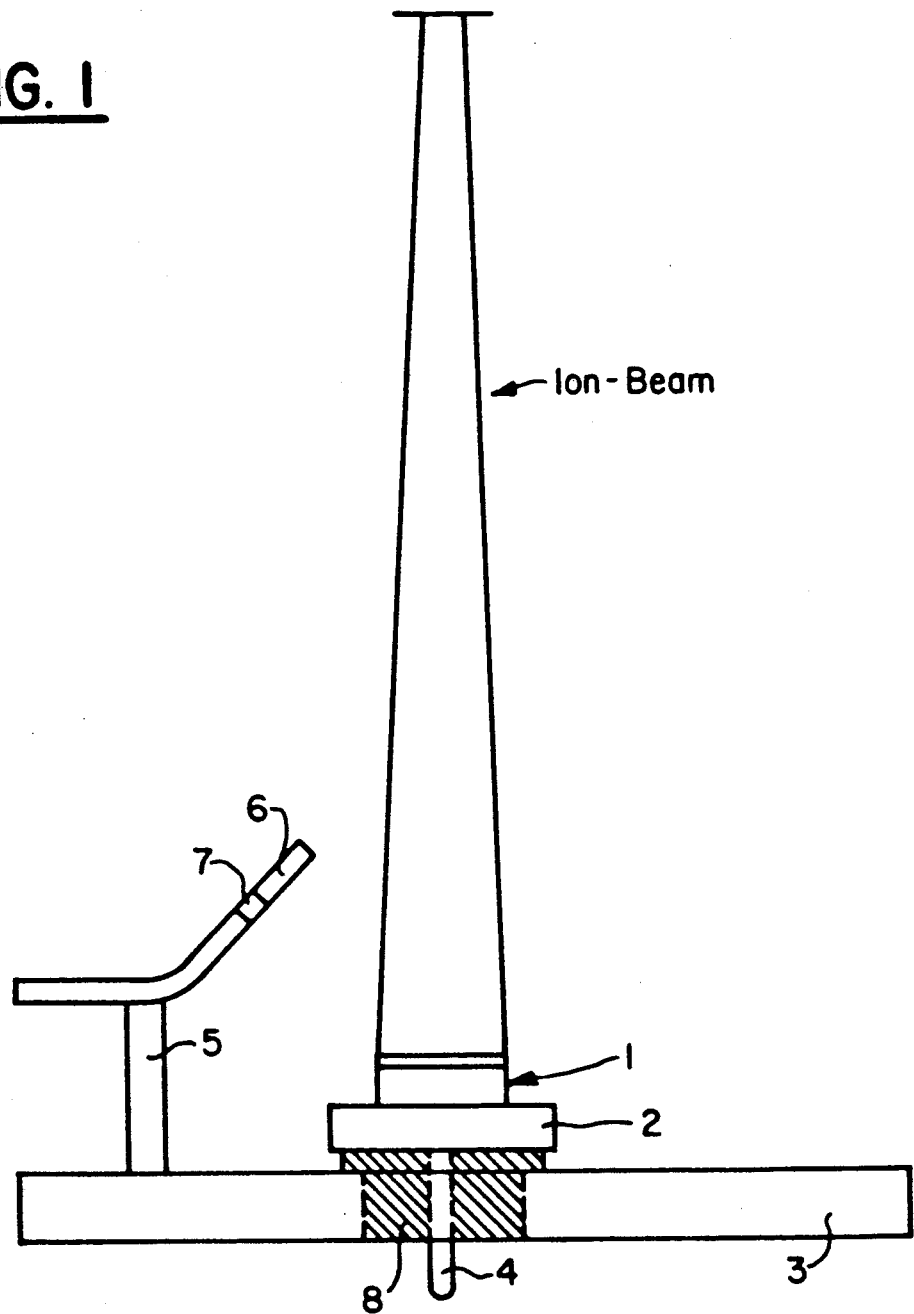
FIG. 1 shows the apparatus which is mounted inside the sputtering chamber according to the first step of the preferred embodiment of this invention.

Gold 10 was sputtered with Ar ions, resulting in the transfer of energy to the gold atoms. A portion of gold 10 moved onto the diamond plate 1, where it bonded to the surface of the diamond. As shown in Figs. 1 and 2, teflon 8 was inserted below sputtering pedestal 2 to provide electrical insulation. The sputtering rate was measured using beam current circuits (not shown).

COMPARATIVE EXAMPLE 1

A standard diamond plate type IIa (Lazare Kaplan International, Inc., N.Y.) with dimensions of about 5 mm $\times$ 5 mm $\times \frac{1}{4}$ mm was chemically cleaned by a four-step process involving conventional techniques. The diamond was washed, first in reagent grade acetone, next in boiling aqua regia, then in "white etch" (3 parts nitric acid, 1 part hydrofluoric acid), and finally in distilled water. The diamond was then dried on Whatman Type 42 filter paper for about 5 minutes.

The apparatus used in this comparative Example was a conventional aluminum oxide crucible in a resistive heater basket. A layer of gold film having a thickness of 1000 angstroms was deposited on the diamond surface at a pressure of $5 \times 10^{-6}$ torr at about room temperature.

The diamond was then exposed in five different regions to 2 Mev helium ions at an integrated beam intensity of several $\times 10^{15}$ ions/cm$^2$. Each region had a triangular shape approximately 1 mm on a side. Each region was bombarded with helium ions for a different length of time.

The adhesion of the gold film was tested using the "Scotch Tape Test", which involved pressing a piece of Scotch transparent tape Type No. 3750-G onto the diamond, and then removing the tape within a matter of seconds. The piece of tape which was used was larger than the diamond. Substantially all of the gold film adhered to the tape and thus was removed from the diamond surface. With some of the trials, there was no adhesion at all between the gold and diamond.

The appearance of the gold film was observed with a Leitz Orthoplan microscope having both reflected and transmitted illumination. The helium ion implantation produced five triangular darkened areas, which were manifestations of graphitization below the surface of the diamond.

The results of this test showed that conventional ion beam mixing does not improve the bond strength between a diamond substrate and a gold film deposited thereon.

EXAMPLE 1

The standard diamond plate type IIa from Comparative Example 1 was chemically cleaned as described in Comparative Example 1. A diamond mask 23 (10 mm ×10 mm ×4 mm) was chemically cleaned by the same procedure. The diamond substrate and mask was fastened into the specimen holder 1 as depicted in FIG. 3, with a portion of the diamond 25 being covered by the mask 23. The specimen holder was then placed inside a General Ionex Model 1320 sputtering chamber (not shown). The mask 23. and diamond 25 were placed in alignment with the ion beam such that no material would be sputtered onto the covered diamond during the predeposition sputtering of the diamond with Ar ions.

The specimen holder 1 was made of brass and had dimensions of $\frac{3}{4}'' \times \frac{3}{4} \times 1/16''$, as shown in FIG. 4.

The specimen holder was placed in the path of the ion beam, about 17 cm from the beam entrance into the chamber. The beam diameter was about the same as the diameter of the specimen holder (but slightly larger), having a diameter of about one inch. The mask was placed between the sputtering material outlet and the diamond such that only a portion of the diamond surface was exposed to sputtering.

The diamond was then sputtered with Ar, using an Ar beam current of 0.5 milliamps at 14 keV for 98 minutes. The chamber pressure was $4.2 \times 10^{-5}$ torr during the sputtering of the diamond. At the conclusion of the argon sputtering, the argon pressure temporarily was increased to above atmospheric pressure to prevent the diffusion of air into the chamber while the diamond mask was removed. The mask was removed from the specimen holder using a glove box arrangement (not shown) around the chamber to avoid the entry of air into the chamber, and a piece of high purity gold (with impurities of less than 10 ppm) having a diameter of about 1 cm and a thickness of about 2 mm (Johnson Matthey Chemicals) was placed in the holder in the path of the ion beam a shown in FIG. 2.

Gold was sputtered onto the diamond for about six hours at a rate of about 1200 angstroms per hour at 13.5 keV and 0.25 milliamps. The chamber pressure was $5.4 \times 10^{-5}$ torr throughout the deposition. The process was conducted at room temperature.

The appearance of the gold films in the argon cleaned and uncleaned regions of the diamond was observed. The reduced thickness of the diamond resulting from the sputtering away of the surface of the diamond could be seen. Furthermore, the gold film in the argon sputtered region was more uniform in thickness and had a slightly different appearance which, as later shown, was caused by the difference in smoothness of the Ar sputtered region and the non-Ar sputtered region.

A microscopic examination with dark field illumination using a Leitz Orthoplan microscope using dark field reflected illumination (objective: Leitz Model HD F150, numerical aperture 0.75) revealed a marked difference between the gold films in the non-argon sputtered region and the argon sputtered region. In the first region, the gold film was not uniform and was characterized by a patina surface in some regions. The patina ended abruptly where the argon cleaned region began. The sputtered region had a gold film which was smooth, with no flaws observed.

The two regions were studied with a scanning electron microscope (International Scientific: Scanning Microscope Model SX-40). The gold film on the uncleaned region had a distinctive matted structure, with the "mounds" being approximately 0.1 to 1 micron wide and less than 0.2 microns high. On the other hand, it was not possible to discern any structure in the gold films in the argon cleaned region. Thus, any surface variations on the Ar cleaned region would have to have been less than the microscope resolution of about 400 angstroms. These observations showed the smoothness of the film formed according to this invention.

Scotch transparent tape Type 3750-G was pressed onto the gold film and removed. Care was taken to be certain that all of the film was covered by the tape prior to its removal. This procedure was carried out under a microscope to insure that sufficient tape-film contact was made. This procedure of applying and removing the tape was repeated several times.

The results of the Scotch Tape Test were that gold was removed only in the region which was masked by the diamond film, i.e. the area which was not sputtered with Ar. The gold film broke near the demarcation of the unsputtered-sputtered region. No gold was removed from the region sputtered with Ar prior to deposition of the gold film. Much of the gold was removed from the region which was not sputtered with Ar prior to deposition of gold.

Ion mixing alone did not increase the adhesive strength of the bond between the gold and diamond, as shown by comparative Example 1. On the other hand, as shown by Example 1, there was a substantial improvement in the adhesion of sputtered gold films to the same type of surface when the diamond was sputtered with argon ions prior to deposition of the gold and the diamond is kept in an argon atmosphere during and between all sputtering processes.

While the invention has been described with reference to what is considered to be the preferred embodiment, it is to be understood that the invention is not to be limited to the disclosed embodiment, but is intended to cover various modifications and arrangements included within the scope of the claims. For example, other deposition methods can be used for forming films on substrates, including as non-limiting examples, evaporation and plating. Furthermore, many types of substrates and film forming materials can be used, as well as mixtures of such materials.

We claim:

1. A method for forming a gold film bonded to a diamond substrate which comprises:
   (a) subjecting a surface of a diamond substrate to sputtering with a stream of ions of an inert gas at about room temperature and under vacuum, said ions having sufficient force and energy to substantially change the surface characteristics of said substrate, and
   (b) subsequently exposing a film-forming material which is gold to a stream of ions of an inert gas at about room temperature and under vacuum, said ions having sufficient energy to sputter the atoms of said filmforming material and to transmit the sputtered atoms to the substrate surface with sufficient force to form a gold film bonded to the diamond substrate.

2. The method of claim 1, wherein said substrate is pre-treated prior to being subjected to the stream of ions in (a) to remove contaminants therefrom.

3. The method of claim 2, wherein said pretreatment comprises chemical cleaning.

4. The method of claim 1, wherein said film has an adhesive strength sufficient too prevent removal from said substrate by adhesive tape.

5. The method of claim 1, wherein a portion of said substrate surface is masked to prevent bonding of said film-forming material to said portion.

6. The method of claim 1, wherein said ions of an inert gas comprise Ar.

* * * * *